United States Patent

Honmura

[19]

[11] Patent Number: 5,903,580
[45] Date of Patent: May 11, 1999

[54] FAULT SIMULATOR OF CREATING A SIGNAL PATTERN FOR USE IN A FAULT INSPECTION OF A SEMICONDUCTOR INTEGRATED CIRCUIT

[75] Inventor: Hiroshi Honmura, Tokyo, Japan

[73] Assignee: NEC Corporation, Tokyo, Japan

[21] Appl. No.: 08/861,731

[22] Filed: May 22, 1997

[30] Foreign Application Priority Data

May 22, 1996 [JP] Japan ................................. 8-126939

[51] Int. Cl.$^6$ ........................................................ G01R 31/28
[52] U.S. Cl. ........................ 371/27.4; 371/25.1; 371/26; 364/578
[58] Field of Search .............................. 371/27.4, 22.1, 371/25.1, 26, 67.1, 3; 395/183.09; 364/550, 578, 551.01, 552

[56] References Cited

U.S. PATENT DOCUMENTS 5,479,414   12/1995   Keller et al. ........................... 371/22.3
5,596,586   1/1997    Sakai ...................................... 371/25.1

OTHER PUBLICATIONS

Verifault–XL Training Course, "Conceptual Overview", Rev. 3.0, pp. 2–3 and 2–5.

*Primary Examiner*—Hoa T. Nguyen
*Attorney, Agent, or Firm*—Foley & Lardner

[57] ABSTRACT

A fault simulator comprises a storage for storing a truth table that is a fault model, a simulation executing unit for executing a simulation on the basis of a given signal pattern by the use of the truth table stored in the storage, a simulation result judging unit for analyzing a result of the simulation by the simulation executing unit and judging whether a fault in a circuit to be inspected can be detected by the signal pattern, and a judgment result output device for displaying a judgment result by the simulation result judging unit, characterized in that the truth table stored in the storage is created in such a way as to reflect a fault of an internal circuit in a block realizing one function forming the semiconductor integrated circuit, the fault making the output of the block high impedance.

13 Claims, 11 Drawing Sheets

| INPUT | | OUTPUT:Out1 | | | | |
|---|---|---|---|---|---|---|
| | | AT THE NORMAL TIME | AT THE FAULT TIME | | | |
| In1 | In2 | | P1 | P2 | N1 | N2 |
| L | L | H | H | H | H | H |
| L | H | H | *HOLD | H | H | H |
| H | L | H | H | *HOLD | H | H |
| H | H | L | L | L | *HOLD | *HOLD |

FIG. 2

| INPUT | | OUTPUT:Out1 | | | | |
|---|---|---|---|---|---|---|
| | | AT THE NORMAL TIME | AT THE FAULT TIME | | | |
| In1 | In2 | | P1 | P2 | N1 | N2 |
| L | L | H | H | H | H | H |
| L | H | H | *HOLD | H | H | H |
| H | L | H | H | *HOLD | H | H |
| H | H | L | L | L | *HOLD | *HOLD |

FIG. 5 C

| INPUT | | OUTPUT:Out1 | | | | | |
|---|---|---|---|---|---|---|---|
| | | AT THE NORMAL TIME | AT THE FAULT TIME | | | | |
| In1 | In2 | | C1 | C2 | C3 | C4 | C5 |
| L | L | H | H | H | * HOLD | H | H |
| L | H | H | * HOLD | H | * HOLD | H | H |
| H | L | H | H | * HOLD | * HOLD | H | H |
| H | H | L | L | L | L | * HOLD | * HOLD |

FIG. 6 C
(PRIOR ART)

| INPUT | | OUTPUT:Out1 | | | | | | |
|---|---|---|---|---|---|---|---|---|
| In1 | In2 | AT THE NORMAL TIME | AT THE FAULT TIME | | | | | |
| | | | In1=L | In1=H | In2=L | In2=H | Out1=L | Out1=H |
| L | L | H | H | H | H | H | L | H |
| L | H | H | H | L | H | H | L | H |
| H | L | H | H | H | H | L | L | H |
| H | H | L | H | L | H | L | L | H | large">5,903,580

FAULT SIMULATOR OF CREATING A SIGNAL PATTERN FOR USE IN A FAULT INSPECTION OF A SEMICONDUCTOR INTEGRATED CIRCUIT

BACKGROUNDS OF THE INVENTION

1. Field of the Invention

The present invention relates to a simulator that performs a simulation on an operation of a semiconductor integrated circuit, and more particularly, to a fault simulator that performs a fault simulation by creating a signal pattern for use in a fault inspection of a semiconductor integrated circuit formed by a MOS transistor.

2. Description of the Related Art

A fault simulation model for use in this kind of the conventional fault simulator has been used for a fault simulation under a single degenerate mode. The single degenerate mode is in a simulating way of fixing each signal level in the whole input/output terminals as "H (high level)" or "L (low level)" in every block including one function, such as an AND circuit, an OR circuit, a flip flop circuit, or the like (hereinafter, referred to as a function block), in the assumption that only one fault exists in one circuit. When the signal level is fixed at "H" in the input/output terminals, it is called an "H fault". When it is fixed at "L", it is called an "L fault".

An operation of the fault simulation by the single degenerate mode will be described, by way of example, in a two input NAND circuit.

FIG. 6A is a symbolic view of a two input NAND circuit including two input, In1 and In2, and one output, Out1. FIG. 6B is a circuit view showing a constitution of the internal circuit of the NAND circuit illustrated in FIG. 6A. FIG. 6C is a truth table showing an operation in the case of applying the conventional fault model to the NAND circuit illustrated in FIGS. 6A and 6B.

The content of the truth table shown in FIG. 6C corresponds to the fault model for a simulation. With reference to FIG. 6C, when both signal level of the input In1 and In2 is "L", the signal level of the output Out1 is "H" at the normal time in the NAND circuit shown in FIG. 6A. Similarly, when the signal level of the input In1 is "L" and the signal level of the input In2 is "H", the signal level of the output Out1 is "H" at the normal time. When the signal level of the input In1 is "H" and the signal level of the input In2 is "L", the signal level of the output Out1 is "H" at the normal time. When both signal level of the input In1 and In2 is "H", the signal level of the output Out1 is "L" at the normal time.

When the input In1 is at the "L fault", it is shown in the truth table of FIG. 6C in the space of "In1=L" at the failure of the output Out1 that the signal level of the output Out1 is "H" when In1="H" and In2="H". This is different from the signal level "L" of the output Out1 at the normal time. Therefore, if there exists the case where In1="H" and In2="H" in a signal pattern created for a fault simulation, the "L fault" of the input In1 can be detected by the simulation with the use of this signal pattern.

For example, the signal pattern illustrated in the timing chart of FIG. 7 consists of three types of state. When the input In1 is at the "H fault", the signal level of the output Out1 is "L" in the first pattern. Accordingly, it is different from the signal level "H" of the output Out1 at the normal time, so that the "H fault" of the In1 can be detected in the first pattern. Similarly, when the input In1 is at the "H fault", it can be detected by the third pattern.

On the contrary, when the input In2 is at the "H fault", the signal level of the output Out1 is in accordance with the output Out1 at the normal time in the three patterns. Therefore, the "H fault" of the input In2 cannot be detected by the signal pattern shown in FIG. 7. When the output wave shape at a specific fault is in accordance with the output wave shape at the normal time as mentioned above, the fault simulator is arranged to inform a designer that the fault cannot be detected by the signal pattern. Then, the designer creates a signal pattern capable of detecting the "H fault" of the input In2 and adds it on to the signal pattern of FIG. 7.

The fault model for use in the above conventional fault simulator, however, is to be applied only to the "H fault" and "L fault" of the input/output in every function block. More specifically, an IC circuit formed by the MOS transistor, since the gate is insulated there, is characterized in that the electric potential of the gate is held if wiring connected with the gate becomes high impedance. This characteristic, however, is not reflected in the above conventional fault model. The simulation by the use of this fault model is unable to create a signal pattern for detecting a fault in the internal circuit of a function block. Therefore, the following problems have occurred.

FIG. 8 shows a selector circuit formed in the combination of three NAND circuits, Q1, Q2, Q3, and one inverter Q4, as a candidate for a simulation. When the simulation by the use of the conventional fault model is performed on the selector circuit illustrated, all the "H fault" and "L fault" in the selector circuit can be detected by the signal pattern indicated in the timing chart of FIG. 9.

Each internal circuit of the NAND circuits Q1, Q2, Q3 consists of two P-type transistors P1, P2 and two N-type transistors N1, N2 as illustrated in FIG. 6B. Consider the case where owing to a fault in the P-type transistor P1 of the internal circuit of the NAND circuit Q1, the transistor P1 still remains OFF even if a signal of the signal level "L" is supplied to the gate of the transistor P1 (such a fault of a transistor is, hereinafter, referred to as an OFF fault). The signal level of the output Z1 in the NAND circuit Q1 varies as indicated in the timing chart of FIG. 10. Specifically, the output terminal Z1 of the NAND circuit Q1 becomes high impedance at the point A. The electric potential in the output terminal Z1 gradually drops from "H", because the electric charge stored as the gate capacitance of the input terminal Z2 in the NAND circuit Q3 of the next stage and as the wiring capacitance between Z1–Z2 starts flowing. Therefore, the selector circuit of FIG. 8 will operate normally until the signal level of the output terminal Z1 in the NAND circuit Q1 drops below the VIHL level.

When a function block contains the above mentioned transistor fault, the state of a signal pattern varies in an IC inspection before the signal level of the output terminal drops below the VIHL level in the function block including the relevant transistor, because continuous period of each signal pattern is short. Thus, the IC inspection cannot find the fault of the circuit, permitting their shipment in the faulted state. In the destination, the continuous period of the identical signal pattern in a signal supplied to the circuit is not necessarily short. When a long signal pattern is supplied there, the electric potential of the output terminal in the function block including the fault of the transistor (the output terminal Z1 of the NAND circuit Q1 in the example of FIG. 8) gets below the VIHL level of the input terminal of the next stage owing to the discharge, which may produce a malfunction in the circuit.

SUMMARY OF THE INVENTION

An object of the present invention is to provide a fault simulator capable of creating such a signal pattern of high reliability in an IC inspection that can detect a faulted IC caused by a fault of the internal circuit of a function block.

In addition to the above object, another object of the present invention is to provide a fault simulator capable of creating a signal pattern of high reliability efficiently in an IC inspection by providing a fault model close to the actual device.

According to one aspect of the invention, a fault simulator that performs a fault simulation for creating a signal pattern for use in a fault inspection of a semiconductor integrated circuit, comprises a storing means for storing a truth table that is a fault model, a simulation executing means for executing a simulation on the basis of a given signal pattern by the use of the truth table stored in the storing means, a simulation result judging means for analyzing a result of the simulation by the simulation executing means and judging whether a fault in a circuit to be inspected can be detected by the signal pattern, and a judgment result output means for displaying a judgment result by the simulation result judging means, wherein the truth table stored in the storing means being created in such a way as to reflect a fault of an internal circuit in a block realizing one function forming the semiconductor integrated circuit, the fault making the output of the block high impedance.

The semiconductor integrated circuit may be formed by a MOS transistor.

In the preferred construction, when a fault exists in the internal circuit of a block realizing one function forming the semiconductor integrated circuit, the truth table stored in the storing means shows that an output signal is held at the previous signal level, on a signal pattern of an input signal such as making the output of the block high impedance.

In the preferred construction, when an OFF fault exists in the internal transistor of a block realizing one function forming the semiconductor integrated circuit, the truth table stored in the storing means shows that an output signal is held at the previous signal level, on a signal pattern of an input signal such as making the output of the block high impedance.

In another preferred construction, when a contact failure exists in the internal circuit of a block realizing one function forming the semiconductor integrated circuit, the truth table stored in the storing means shows that an output signal is held at the previous signal level, on a signal pattern of an input signal such as making the output of the block high impedance.

The storing means may store several kinds of truth tables which have been created, depending on the type of a fault in the internal circuit of a block realizing one function forming the semiconductor integrated circuit, with consideration of a fault such as to make the output of the block high impedance, and the simulation executing means may perform a simulation in a combination of several kinds of the truth tables stored in the storing means.

In another preferred construction, when a fault exists in the internal circuit of a block realizing one function forming the semiconductor integrated circuit, the truth table stored in the storing means shows that an output signal is held at the previous signal level, on a signal pattern of an input signal such as making the output of the block high impedance, and as for a fault in the internal circuit of the block, the existing position thereof is being specified on the basis of the layout of the block.

According to another aspect of the invention, A COMPUTER READABLE MEMORY having a computer program thereon for directing a computer to perform a fault simulation for creating a signal pattern for use in a fault inspection of a semiconductor integrated circuit formed by a MOS transistor by using a truth table that is a fault model, the computer program comprising the steps for controlling the computer to:

executing a simulation on the basis of a given signal pattern by the use of the truth table;

analyzing a result by the simulation step;

judging whether a fault in a circuit to be inspected can be detected by the signal pattern; and displaying a result by the judging step wherein the truth table being created in such a way as to reflect a fault of an internal circuit in a block realizing one function forming the semiconductor integrated circuit, the fault making the output of the block high impedance.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings:

FIG. 2 is a view showing a fault model (truth table) of a two input NAND circuit, which model is applied to the OFF fault of a transistor, for use in the embodiment.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
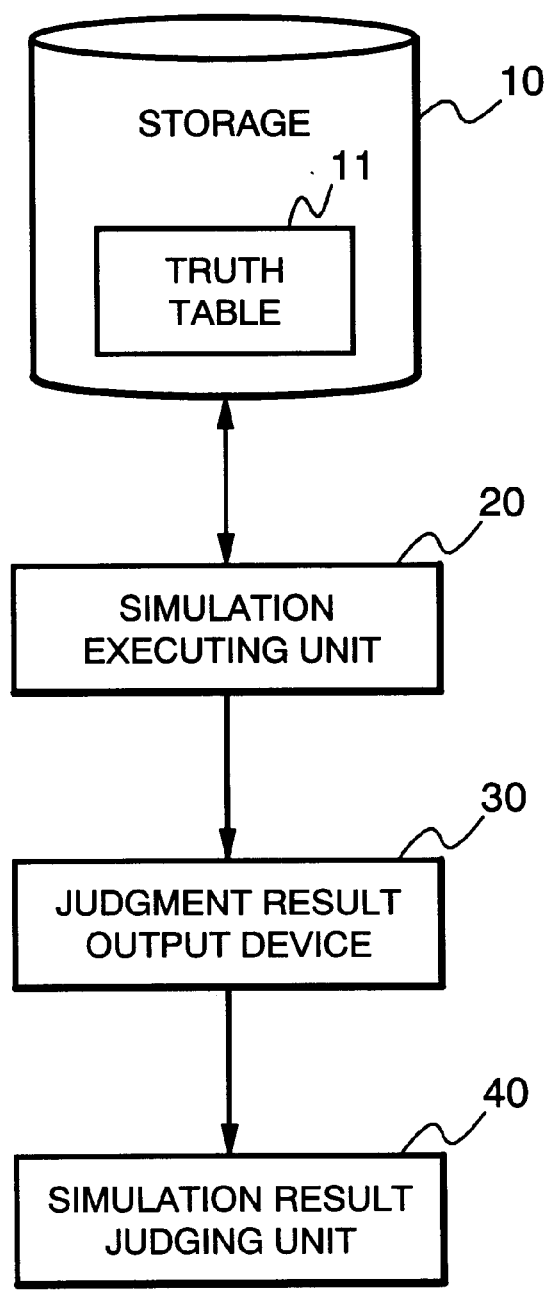
FIG. 1 is a block diagram showing a constitution of a fault simulator according to an embodiment of the present invention.

FIG. 1 is a block diagram showing a constitution of a fault simulator according to an embodiment of the present invention.

As illustrated in FIG. 1, the fault simulator of the embodiment comprises a storage 10 for storing a truth table 11 that is a fault model, a simulation executing unit 20 for executing a simulation by the use of the truth table 11, a simulation result judging unit 30 for judging a result of the simulation by the simulation executing unit 20, and a judgment result output device 40 for displaying a judgment result of the simulation result judging unit 30. FIG. 1 shows only the characteristic components of the embodiment, while the other general components are not shown therein. It is needless to say that an input device for receiving a starting instruction for a simulation and a circuit data, as well as an output device for supplying a simulation result depending on the necessity, are actually provided in this device.

The storage 10 is realized by a semiconductor memory, or an external storage such as a magnetic disk or the like. The truth table 11 stored in the storage 10 is provided, stored in an information storing medium such as a magnetic disk, a semiconductor memory, or the like, alternatively, it is received through a given input device (not illustrated). The simulation executing unit 20 and the simulation result judging unit 30 are realized by a CPU controlled by a computer program and a semiconductor memory such as a RAM or the like. The computer program for controlling the CPU is provided, stored in an information storing medium such as a magnetic disk, a semiconductor memory or the like, so to be reserved in a given storage (for example, the storage 10).

According to the embodiment, the truth table 11 is created considering the case of a fault in the internal circuit of a function block, in addition to the case of the "H fault" and "L fault" of the input/output terminals in the function block. Namely, when a fault occurred in the internal circuit of a function block, since the output of the function block may become high impedance depending on a signal pattern received, each value is written in each "output" space of the truth table 11, considering the characteristic inherent in the MOS transistor that the output value just before is held. By the use of the truth table 11 reflecting an operation of a function block such as holds the output value just before at the fault of the internal circuit, it is possible to create a signal pattern for a simulation capable of detecting a fault in the internal circuit, which could not have been detected by the conventional way of inspection on only the "H fault" and "L fault".

FIG. 2 shows an example of the truth table 11 for use in the embodiment.

Figure 6:
FIG. 6A is a symbolic view representing a two input NAND circuit.
FIG. 6B is a circuit view showing the internal circuit of the two input NAND circuit.
FIG. 6C is a view showing a fault model (truth table) for use in the conventional fault simulator.
Figure 6:
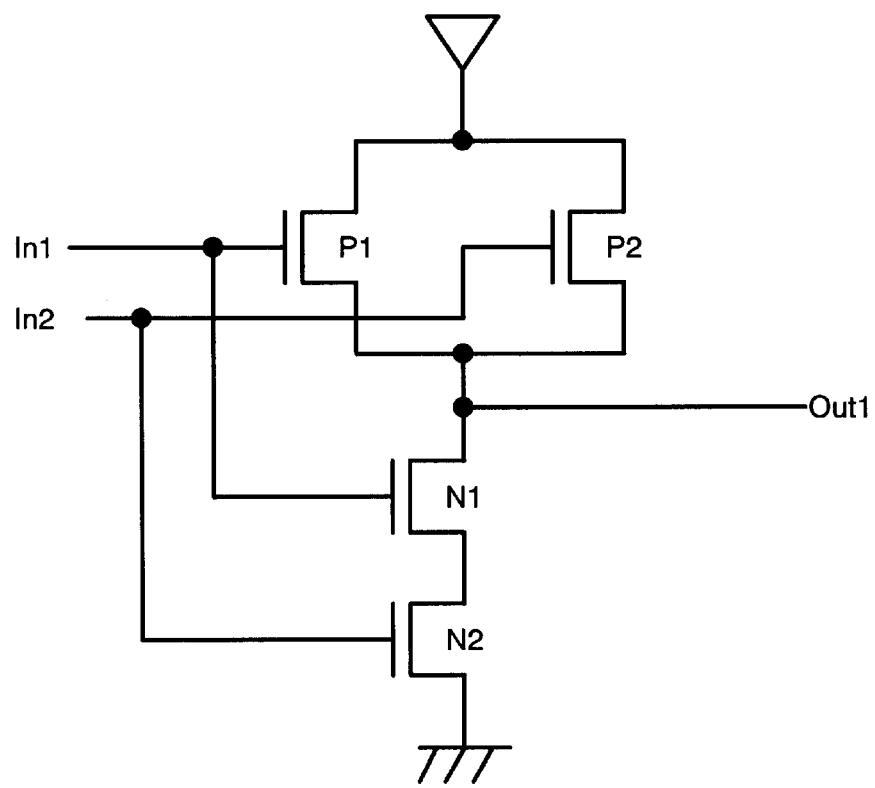
Figure 7:
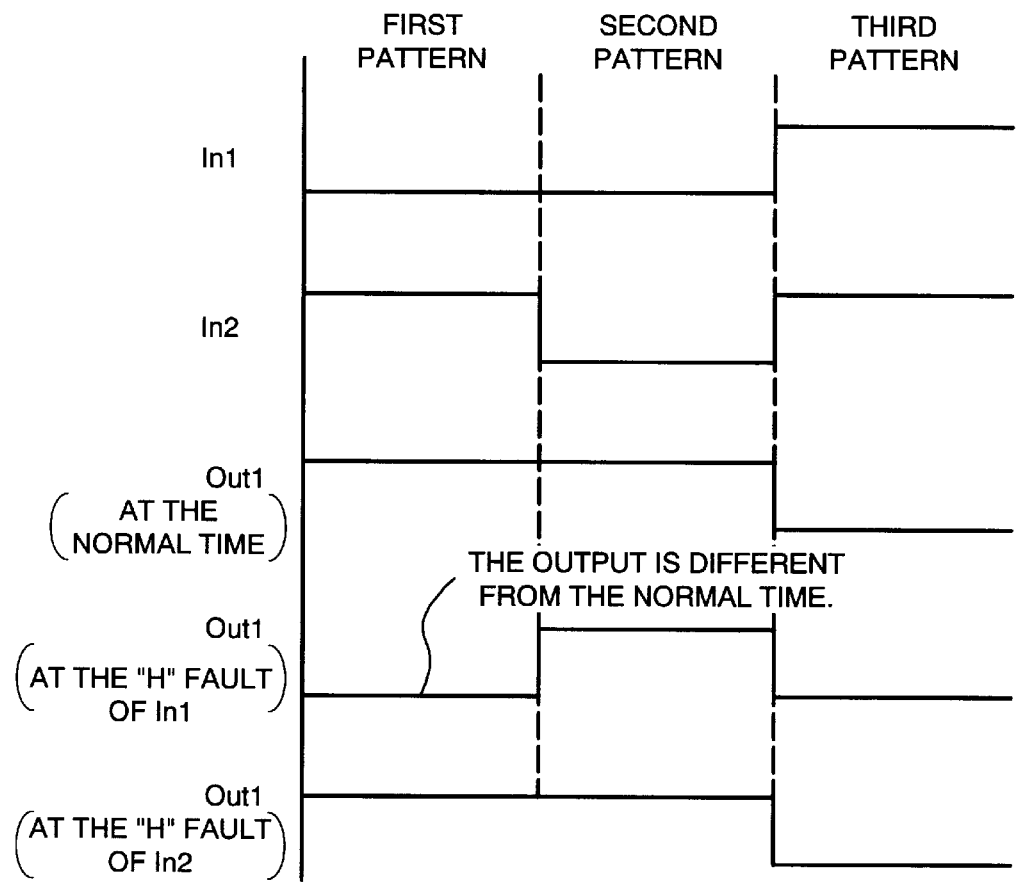
FIG. 7 is a timing chart showing a result of the simulation by the use of the fault model (truth table) of FIG. 6C.

The truth table 11 shown in FIG. 2 contains a fault model for the two input NAND circuit shown in FIGS. 6A and 6B, indicating an operation of the NAND circuit when an OFF fault has occurred in only one transistor. The NAND circuit to be inspected has two input, In1 and In2, and one output, Out1 as shown in FIG. 6A. As shown in FIG. 6B, the first P-type transistor P1 with the input terminal In1 connected to the gate and the second P-type transistor P2 with the input terminal In2 connected to the gate, are connected in parallel, while the first N-type transistor N1 with the input terminal In1 connected to the gate and the second N-type transistor N2 with the input terminal In2 connected to the gate are connected in series so as to connect the source of the transistor N1 and the drain of the transistor N2. Each source of the transistors P1 and P2 is connected to a line source, while each drain of the transistors P1 and P2 is connected to the output terminal Out1. The source of the transistor N2 is connected to the ground, while the drain of the transistor N1 is connected to the output terminal Out1 together with the drains of the transistors P1 and P2.

Referring to the truth table 11 of FIG. 2, there are four combinations of signal level of input signal because the NAND circuit has two input. The signal level of the output terminal Out1 when no fault exists in the circuit, is as shown in the space "at the normal time" of the output Out of the truth table 11. More specifically, when the signal level of the input In1 and In2 is both "L", the signal level of the output Out1 is "H" at the normal time. When the signal level of the input In1 is "L" and the signal level of the input In2 is "H", the signal level of the output Out1 is "H" at the normal time. When the signal level of the input In1 is "H" and the signal level of the input In2 is "L", the signal level of the output Out1 is "H" at the normal time. When the signal level of the input In1 and In2 is both "H", the signal level of the output Out1 is "L" at the normal time.

The signal level of the output terminal Out1 when an OFF fault occurred in each transistor P1, P2, N1, and N2 forming the internal circuit, is as shown in each space "at the fault time" of the output Out of the truth table 11. More specifically, at the OFF fault in the transistor P1, when the signal level of the input In1 is "L" and the signal level of the input In2 is "H", the signal level of the output Out1 just before is held. This is why the transistor P2 turns OFF, the transistor N1 turns OFF, and the transistor N2 turns ON when the signal level of the input In1 is "L" and the signal level of the input In2 is "H" at the OFF fault in the transistor P1, and why the output Out1 becomes high impedance. At the OFF fault in the transistor P2, N1, or N2, the value of the output Out1 just before is held in such a combination of the input In1 and In2 as to make each output Out1 high impedance. Namely, if an OFF fault occurred in the transistor P2, the signal level of the output Out1 just before is held when the signal level of the input In1 is "H" and the signal level of the input In2 is "L". If an OFF fault occurred in the transistor N1 or N2, the signal level of the output Out1 just before is held when the signal level of the input In1 and In2 is both "H".

Upon receipt of the starting instruction of the simulation externally, the simulation executing unit 20 executes a simulation by a given signal pattern, using the truth table 11 of a target circuit stored in the storage 10.

The simulation result judgment unit 30 analyzes a resultant output signal pattern by the simulation executing unit 20 and judges whether the fault can be detected by the signal pattern when there exists a fault in the relevant circuit.

The judgment result output device 40 is realized by, for example, a display, so as to display the judgment result of the simulation result judging unit 30 to inform a design engineer.

This time, creation of a signal pattern to be used in simulation will be described, considering an operation of a simulation on the selector circuit shown in FIG. 8.

Figure 8:
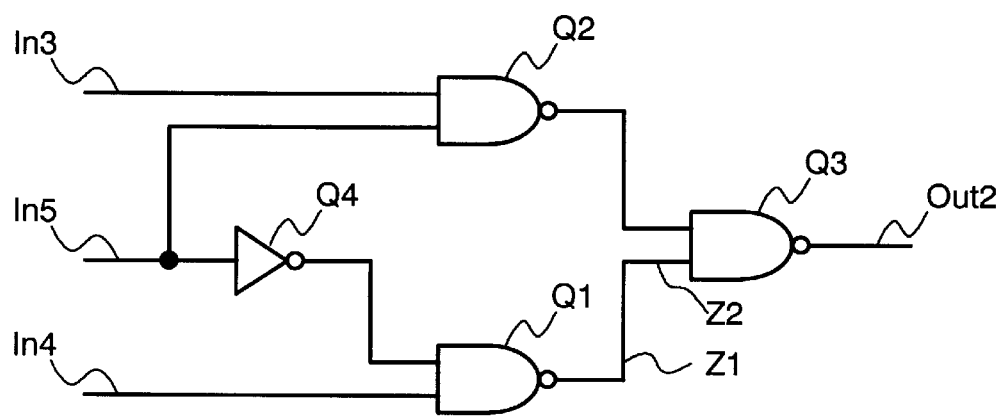
FIG. 8 is a circuit view showing a selector circuit formed in the combination of two input NAND circuits.
Figure 9:
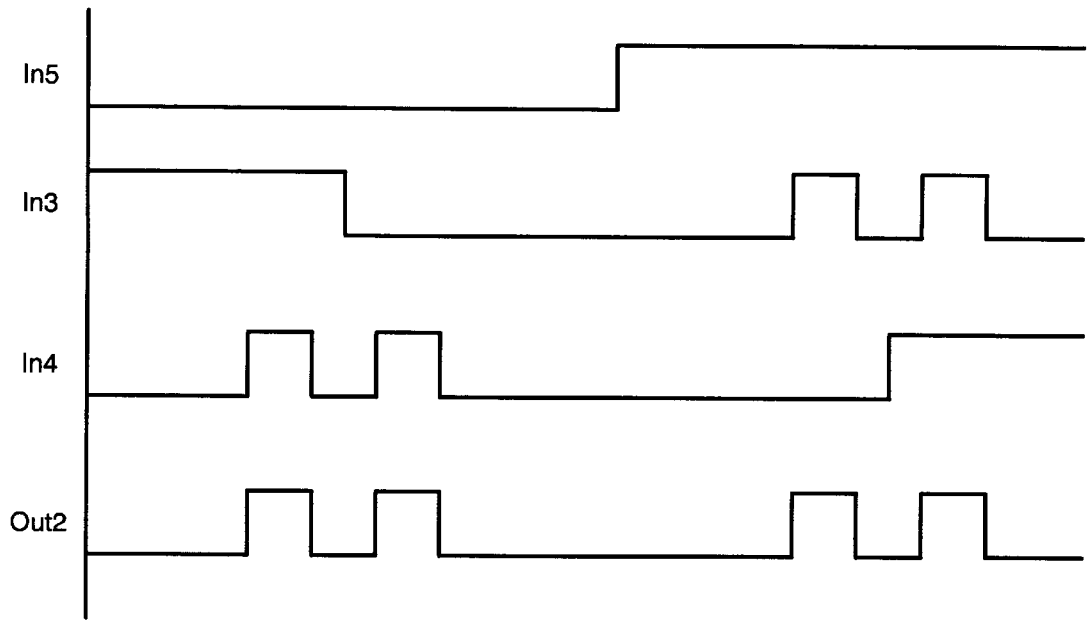
FIG. 9 is a timing chart showing a result of the simulation on the selector circuit of FIG. 8 by the use of the fault model (truth table) of FIG. 6C.

The selector circuit shown in FIG. 8 comprises three NAND circuits Q1, Q2, Q3 and one inverter Q4 as a function block. In the NAND circuit Q1, one of the two input is connected to the input terminal In5 through the inverter Q4, while the other of the two input is connected to the input terminal In4, and the output is connected to one of the input of the NAND circuit Q3. In the NAND circuit Q2, the two input is respectively connected to the input terminals In3 and In5, and the output is connected to the other of the input of the NAND circuit Q3. In the NAND circuit Q3, the two input is respectively connected to the output of the NAND circuit Q1 and Q2, and the output is connected to the output terminal Out2.

Figure 10:
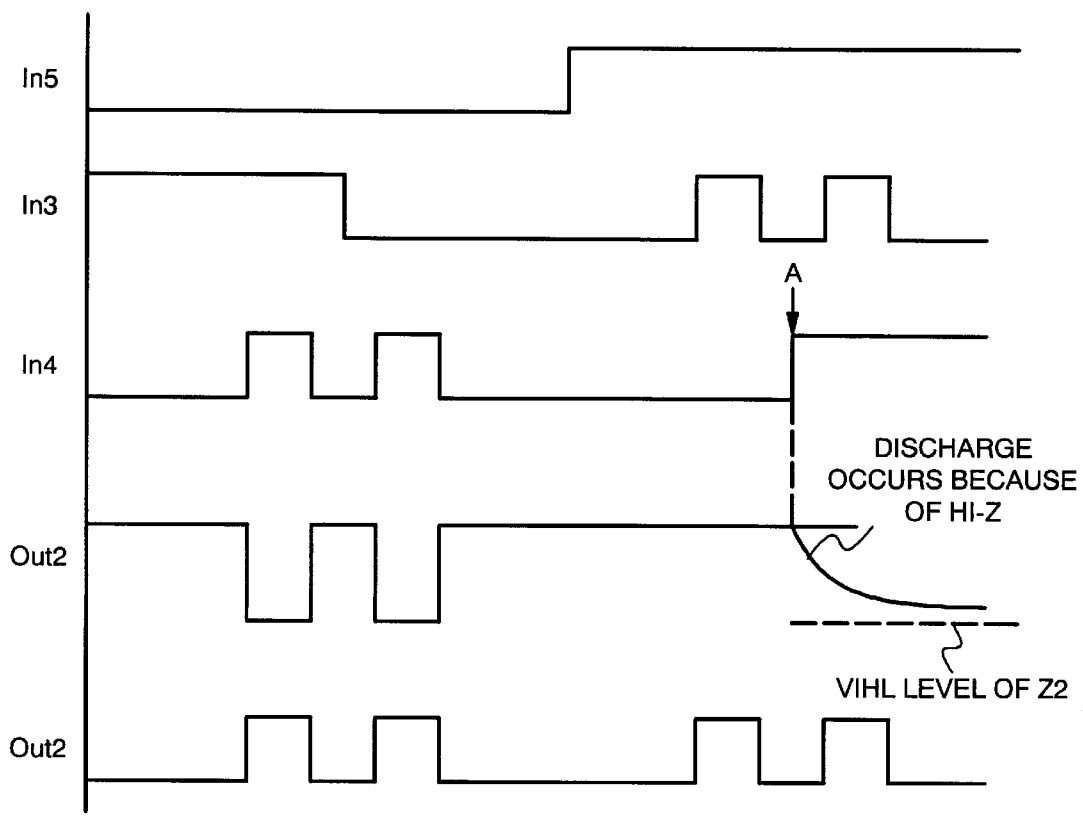
FIG. 10 is a timing chart showing another result of the simulation on the selector circuit of FIG. 8 by the use of the fault model (truth table) of FIG. 6C.

In the above constituted selector circuit, consider the case where an OFF fault has occurred in the transistor P1 forming the NAND circuit Q1. When supplying a signal pattern similar to the signal pattern shown in the timing chart of FIG. 10, to the input terminal In3, In4, and In5, the simulation executing unit 20 simulates the normal case and the fault case of the NAND circuit Q1 (transistor P1), and the simulation result is judged by the simulation result judging unit 30.

Figure 3:
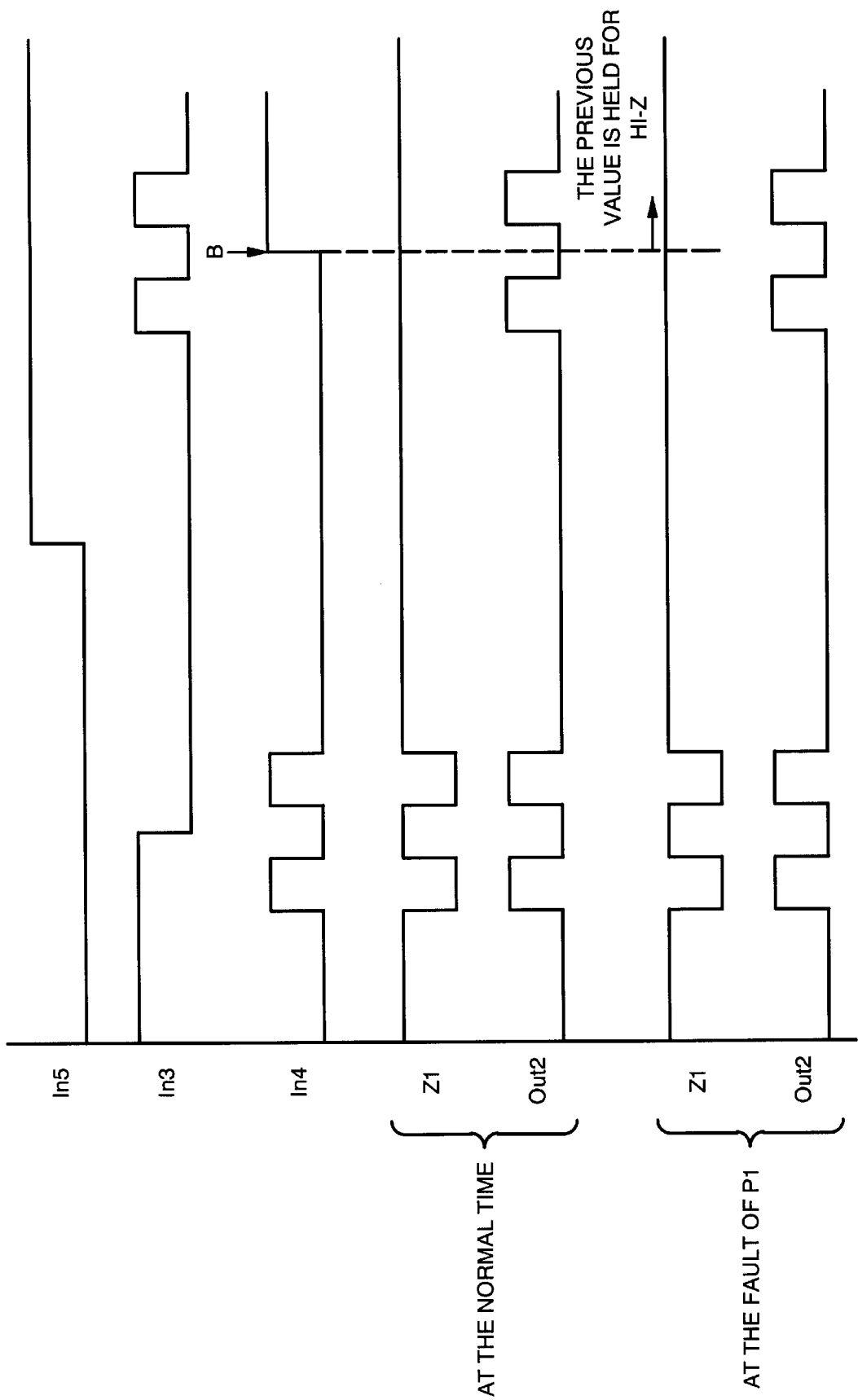
FIG. 3 is a timing chart showing a result of the simulation by the use of the fault model (truth table) of FIG. 2.

Referring to the fault model (truth table 11) of the embodiment in this case, it is found that no fault of the selector circuit can be detected as shown in FIG. 3. Namely, the signal level of the input In1 of the NAND circuit Q1 is "L" and the signal level of the input In2 is "H" at the point B. In this case, according to the truth table 11, the output Z1 is in the hold state, so that the signal level "H" just before is held. Therefore, the output Z1 of the NAND circuit Q1 and the output Out2 of the selector circuit at the normal time has the same pattern as the output Z1 of the NAND circuit Q1 and the output Out2 of the selector circuit at the OFF fault of the transistor P1, as shown in FIG. 3. As mentioned above, even if a fault has occurred in the transistor P1 forming the NAND circuit Q1, there is no difference shown in the signal pattern of the output signal between the normal case and the fault case. Therefore, it is found that the signal pattern illustrated in the figure is unable to detect a fault of the NAND circuit Q1 (that is, a fault of the selector circuit) caused by the OFF fault of the transistor P1.

The simulation result judging unit 30 informs a design engineer of the above judgment result by means of the judgment result output device 40. The design engineer creates a new signal pattern so that the OFF fault of the transistor P1 can be detected.

Figure 4:
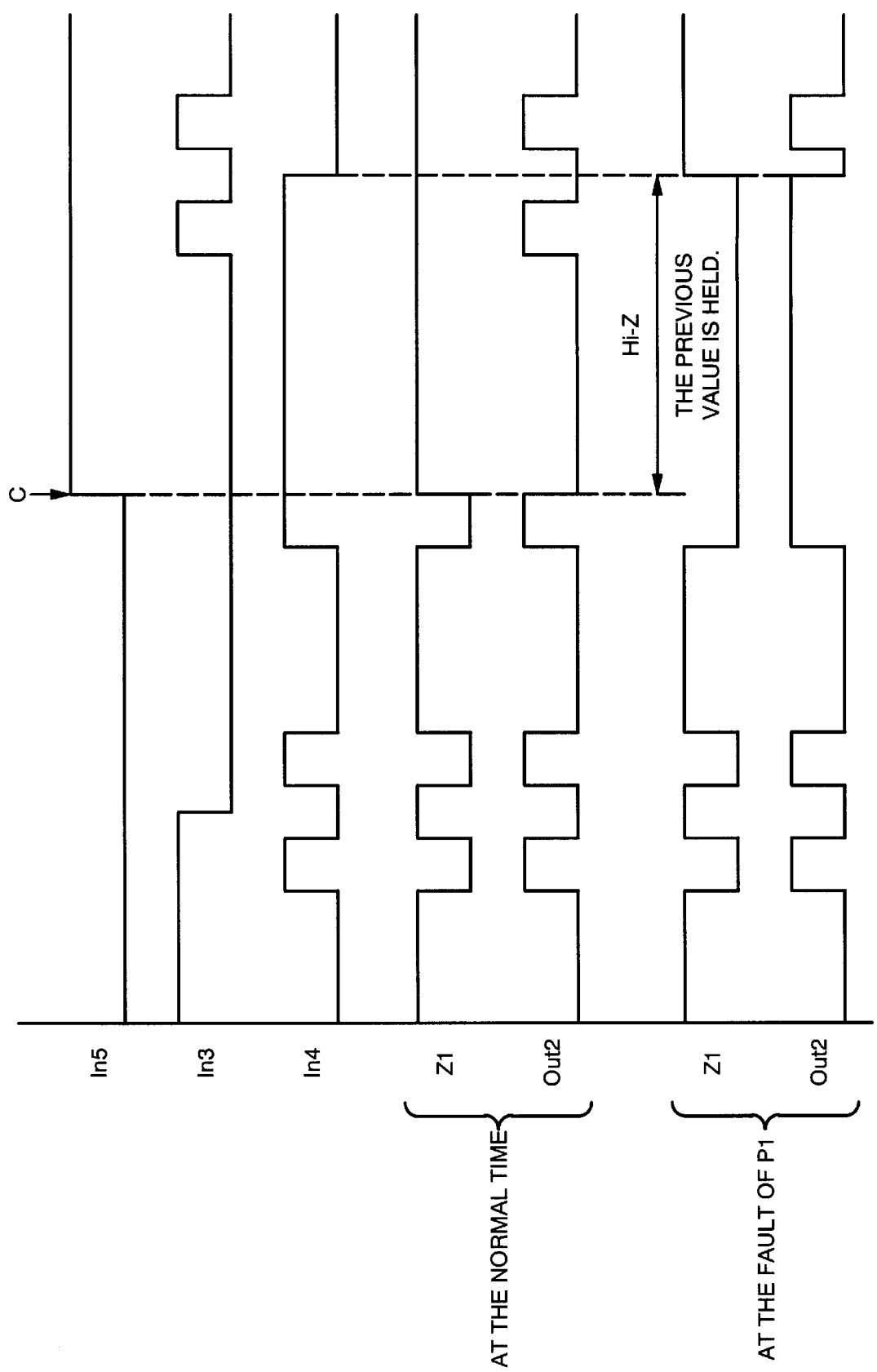
FIG. 4 is a timing chart showing another result of the simulation by the use of the fault model (truth table) of FIG. 2.

Suppose that the signal pattern shown in FIG. 4 is created by the design engineer as a signal pattern for supplying to the input terminals In3, In4, and In5. The simulation executing unit 20 executes a simulation by the use of the signal pattern, and the simulation result judging unit 30 judges the simulation result.

With reference to FIG. 4, the signal level of the input In1 of the NAND circuit Q1 is "L" and the signal level of the input In2 is "H" at the point C. When a fault occurred in the transistor P1 of the NAND circuit Q1, the output Z1 of the NAND circuit Q1 is in the hold state and the signal level "L" just before is held, according to the truth table 11. Since the signal level of the output Z1 is "L", the signal level of the output terminal Out2 of the selector circuit becomes "H". Accordingly, since the signal level in the output terminal Out2 of the selector circuit at the normal time is different from that one at the fault time of the transistor P1 of the NAND circuit Q1, a signal pattern as shown in FIG. 4 could detect a fault of the NAND circuit Q1 (that is, fault in the selector circuit) caused by the OFF fault of the transistor P1.

Next, a fault model for simulating the case where a contact failure has occurred as a fault of the internal circuit in a function block, will be described hereinafter.

Figure 5:
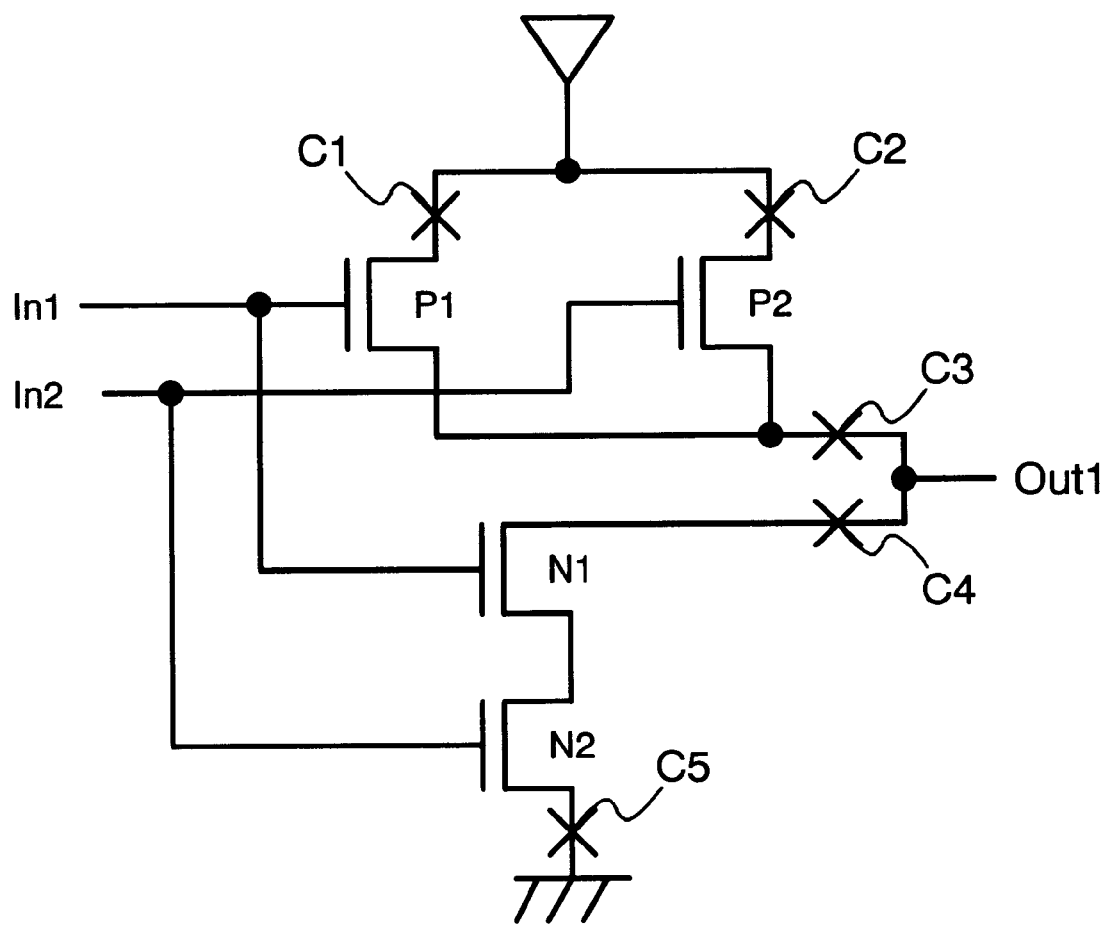
FIG. 5A is a circuit view showing contact positions in the internal circuit of a two input NAND circuit.
FIG. 5B is a view showing a layout of the two input NAND circuit.
FIG. 5C is a view showing a fault model (truth table) of the two input NAND circuit, which model is applied to the contact failure, for use in the embodiment.
Figure 5:
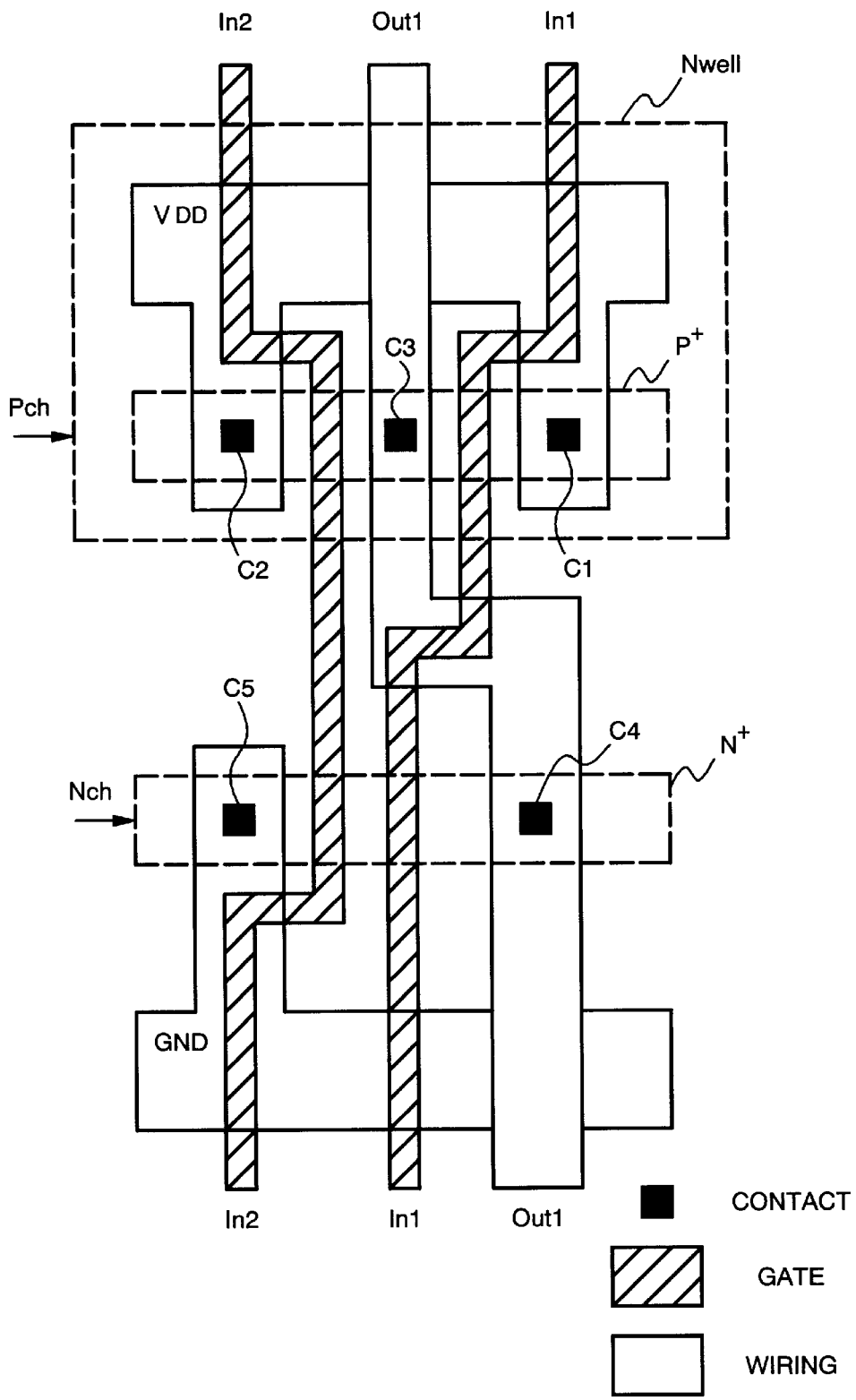

FIG. 5A is a circuit view showing contact positions in the internal circuit of the two input NAND circuit shown in FIG. 6A. FIG. 5B is a view showing a layout of the NAND circuit shown in FIGS. 6A and 5A. FIG. 5C is a truth table showing an operation of the NAND circuit in the case where a contact failure has occurred at only one position in the NAND circuit shown in FIGS. 6A, 5A, and 5B.

The NAND circuit has five contacts C1, C2, C3, C4, and C5 at the positions as illustrated in FIG. 5A. More specifically, the contact C1 exists between the source of the transistor P1 and the line source; the contact C2 exists between the source of the transistor P2 and the line source; the contact C3 exists between the drain of the transistors P1, P2 and the output terminal Out1; the contact C4 exists between the drain of the transistor N1 and the output terminal Out1; and the contact C5 exists between the source of the transistor N2 and the ground. A contact failure means that the P+diffusion layer or the source of the transistor is not connected to the line source $V_{DD}$ in FIG. 5B, for example, in the failure of the contact C1. In the circuit view of FIG. 5A, a contact failure means that the portion of the contact C1 gets into the open state.

Referring to the truth table 11 of FIG. 5C, there are four combinations of signal levels for input signals. The signal level of the output Out1 in the case of no fault occurring in the circuit is as illustrated in the space "at the normal time" of the output Out of the truth table 11.

The signal level of the output terminal Out1 in the case of a contact failure occurring in each contact C1 to C5 in the internal circuit is as shown in each space "at the fault time" of the output Out of the truth table 11. More specifically, the signal level of the input In1 is "L" in the case of the failure of the contact C1, and when the signal level of the input In2 is "H", the signal level of the output Out1 just before is held. This is why, in the case of the failure of the contact C1, the transistor P2 turns OFF, the transistor N1 turns OFF, and the transistor N2 turns ON, if the input In1="L" and In2="H" is supplied, and why the output Out1 becomes high impedance. Similarly, in the case of the failure of each contact C2 to C5, the value of the output Out1 just before is held in such a combination of the input In1 and In2 as to make each output Out1 high impedance. More specifically, when the signal level of the input In1 is "H" and the signal level of the input In2 is "L" in the failure of the contact C2, the signal level of the output Out1 just before is held. When at least one of the signal levels of the input In1 and In2 is "L" in the case of the failure of the contact C3, the signal level of the output Out1 just before is held. When both signal level of the input In1 and In2 is "H" in the failure of the contact C4 or C5, the signal level of the output Out1 just before is held.

Simulating a target circuit by the use of the truth table 11 shown in FIG. 5C enables the creation of a signal pattern capable of detecting a fault in a NAND circuit (that is, a fault in the target circuit) caused by the contact failure even in the case of a contact failure in the NAND circuit included in the target circuit.

Hereinabove, the fault simulator having the fault model (truth table) for creating the signal pattern capable of detecting a fault in the internal circuit of a function block has been described by way of example of the OFF fault and contact fault of a transistor. Additionally, wiring trouble, diffusion failure, and the like may be supposed as a fault of the internal circuit. In order to cope with these faults, a fault model (truth table) with consideration of the case where the output level just before is held at the high impedance of the output in a function block, is used to create a signal pattern capable of detecting these faults. These various truth tables and the conventional truth table for "H fault" and "L fault" are used in a combination in the simulation, thereby to create a signal pattern of higher reliability.

Although in the above mentioned example, the description has been made by way of example of the two input NAND circuit as a function block, the embodiment can be similarly adopted to any function block such as an OR circuit, a flip flop circuit, and the like, by the use of a fault model (truth table) with consideration of the case where the output level just before is held in the output signal at the fault of high impedance of the output.

As set forth hereinabove, the fault simulator of the present invention performs a simulation by the use of a fault model (truth table) created considering the case of the electric potential being held in the gate because the wiring connected to the gate becomes high impedance in a function block, thereby to create a signal pattern capable of detecting a fault in a semiconductor circuit involving a fault such as to make the output of the function block high impedance, which fault is difficult to be detected by the IC inspection. As a result, the IC inspection by the use of the above-mentioned signal pattern can improve the reliability of the inspection.

Since a probable fault such as a contact failure and an open failure of the wiring can be reflected in a fault model (truth table), where the position of a fault can be specified on the basis of the layout of a function block, it is possible to create a fault model (truth table) close to the actual device. As a result, the IC inspection by the use of the above-mentioned signal pattern can improve the reliability of the inspection.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A fault simulator that performs a fault simulation for creating a signal pattern for use in a fault inspection of a semiconductor integrated circuit, comprising:
    a storing means for storing a truth table that is a fault model;
    a simulation executing means for executing a simulation on the basis of a given signal pattern by the use of the truth table stored in said storing means;
    a simulation result judging means for analyzing a result of the simulation by said simulation executing means and judging whether a fault in a circuit to be inspected can be detected by the signal pattern; and
    a judgment result output means for displaying a judgment result by said simulation result judging means;
    wherein said truth table stored in said storing means being created in such a way as to reflect a fault of an internal circuit in a block realizing one function forming the semiconductor integrated circuit, the fault making the output of the block high impedance.

2. A fault simulator as set forth in claim 1, wherein said semiconductor integrated circuit being formed by a MOS transistor.

3. A fault simulator as set forth in claim 1, wherein
    when a fault exists in the internal circuit of a block realizing one function forming the semiconductor integrated circuit, the truth table stored in said storing means shows that an output signal is held at the previous signal level, on a signal pattern of an input signal such as making the output of the block high impedance.

4. A fault simulator as set forth in claim 1, wherein
    when an OFF fault exists in the internal transistor of a block realizing one function forming the semiconductor integrated circuit, the truth table stored in said storing means shows that an output signal is held at the previous signal level, on a signal pattern of an input signal such as making the output of the block high impedance.

5. A fault simulator as set forth in claim 1, wherein
    when a contact failure exists in the internal circuit of a block realizing one function forming the semiconductor integrated circuit, the truth table stored in said storing means shows that an output signal is held at the previous signal level, on a signal pattern of an input signal such as making the output of the block high impedance.

6. A fault simulator as set forth in claim 1, wherein
    said storing means stores several kinds of truth tables which have been created, depending on the type of a fault in the internal circuit of a block realizing one function forming the semiconductor integrated circuit, with consideration of a fault such as to make the output of the block high impedance, and
    said simulation executing means performs a simulation in a combination of several kinds of the truth tables stored in said storing means.

7. A fault simulator as set forth in claim 1, wherein
    when a fault exists in the internal circuit of a block realizing one function forming the semiconductor integrated circuit, the truth table stored in said storing means shows that an output signal is held at the previous signal level, on a signal pattern of an input signal such as making the output of the block high impedance, and
    as for a fault in the internal circuit of the block, the existing position thereof is being specified on the basis of the layout of the block.

8. A COMPUTER READABLE MEMORY having a computer program thereon for directing a computer to perform a fault simulation for creating a signal pattern for use in a fault inspection of a semiconductor integrated circuit formed by a MOS transistor by using a truth table that is a fault model, said computer program comprising the steps for controlling the computer to:
    executing a simulation on the basis of a given signal pattern by the use of the truth table;
    analyzing a result by said simulation step;
    judging whether a fault in a circuit to be inspected can be detected by the signal pattern; and
    displaying a result by said judging step
    wherein said truth table being created in such a way as to reflect a fault of an internal circuit in a block realizing one function forming the semiconductor integrated circuit, the fault making the output of the block high impedance.

9. A COMPUTER READABLE MEMORY as set forth in claim 8, wherein when a fault exists in the internal circuit of a block realizing one function forming the semiconductor integrated circuit, the truth table shows that an output signal is held at the previous signal level, on a signal pattern of an input signal such as making the output of the block high impedance.

10. A COMPUTER READABLE MEMORY as set forth in claim 8, wherein when an OFF fault exists in the internal transistor of a block realizing one function forming the semiconductor integrated circuit, the truth table shows that an output signal is held at the previous signal level, on a signal pattern of an input signal such as making the output of the block high impedance.

11. A COMPUTER READABLE MEMORY as set forth in claim 8, wherein when a contact failure exists in the internal circuit of a block realizing one function forming the semiconductor integrated circuit, the truth table shows that an output signal is held at the previous signal level, on a signal pattern of an input signal such as making the output of the block high impedance.

12. A COMPUTER READABLE MEMORY as set forth in claim 8, wherein several kinds of truth tables are provided which have been created, depending on the type of a fault in the internal circuit of a block realizing one function forming the semiconductor integrated circuit, with consideration of a fault such as to make the output of the block high impedance.

13. A COMPUTER READABLE MEMORY as set forth in claim 8, wherein when a fault exists in the internal circuit of a block realizing one function forming the semiconductor integrated circuit, the truth table shows that an output signal is held at the previous signal level, on a signal pattern of an input signal such as making the output of the block high impedance, and as for a fault in the internal circuit of the block, the existing position thereof is being specified on the basis of the layout of the block.

\* \* \* \* \*